(12) United States Patent
Hatanaka et al.

(10) Patent No.: US 7,598,182 B2
(45) Date of Patent: Oct. 6, 2009

(54) ANTI-REFLECTIVE COATING FORMING COMPOSITION CONTAINING POLYAMIC ACID

(75) Inventors: Tadashi Hatanaka, Toyama (JP); Tomoyuki Enomoto, Toyama (JP); Shigeo Kimura, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 423 days.

(21) Appl. No.: 10/569,471

(22) PCT Filed: Aug. 27, 2004

(86) PCT No.: PCT/JP2004/012389

§ 371 (c)(1), (2), (4) Date: Feb. 24, 2006

(87) PCT Pub. No.: WO2005/022261

PCT Pub. Date: Mar. 10, 2005

(65) Prior Publication Data

US 2007/0004228 A1 Jan. 4, 2007

(30) Foreign Application Priority Data

Aug. 28, 2003 (JP) ............... 2003-304376

(51) Int. Cl.
*G03C 1/00* (2006.01)
(52) U.S. Cl. .................... 438/758; 430/270.1; 438/952; 252/501.1
(58) Field of Classification Search ................ 438/758, 438/952, 948; 430/270.1, 311, 319; 252/501.1, 252/589
See application file for complete search history.

(56) References Cited

U.S. PATENT DOCUMENTS 5,643,986 A 7/1997 Ishikawa et al.
5,770,346 A * 6/1998 Iwasa et al. ............... 430/270.1
5,939,236 A * 8/1999 Pavelchek et al. ......... 430/273.1
6,001,517 A * 12/1999 Kawamonzen ................ 430/18
6,156,479 A 12/2000 Meador et al.
6,455,416 B1 9/2002 Subramanian et al.
2003/0166828 A1 9/2003 Cox et al.

FOREIGN PATENT DOCUMENTS

| EP | 0 159 428 | 10/1985 |
|---|---|---|
| EP | 0 264 650 | 4/1988 |
| EP | 1 241 527 A1 | 9/2002 |
| EP | 1 378 796 A1 | 1/2004 |
| JP | A 59-93448 | 5/1984 |
| JP | A-1-245249 | 9/1989 |
| JP | A 01-281730 | 11/1989 |
| JP | A 02-008221 | 1/1990 |
| JP | A-5-72736 | 3/1993 |
| JP | A 05-156231 | 6/1993 |
| JP | A 09-078031 | 3/1997 |
| JP | A 09-118808 | 5/1997 |
| JP | B 2686898 | 8/1997 |
| JP | A 09-244238 | 9/1997 |
| JP | A 11-072925 | 3/1999 |
| JP | A 2000-007783 | 1/2000 |
| JP | A 2004-126161 | 4/2004 |
| JP | A 2004-212907 | 7/2004 |
| WO | WO 02/086624 A1 | 10/2002 |
| WO | WO 03/057678 A1 | 7/2003 |
| WO | WO 03/058345 A2 | 7/2003 |

\* cited by examiner

*Primary Examiner*—Walter L Lindsay, Jr.
*Assistant Examiner*—Reema Patel
(74) *Attorney, Agent, or Firm*—Oliff & Berridge, PLC

(57) ABSTRACT

There is provided an anti-reflective coating forming composition for use in a lithography and for forming an anti-reflective coating that can be developed with an alkaline developer for photoresist, and a method for forming photoresist pattern by use of the anti-reflective coating forming composition. Concretely, the composition comprises a polyamic acid produced from a tetracarboxylic dianhydride compound and a diamine compound having at least one carboxyl group, a compound having at least two epoxy groups, and a solvent.

14 Claims, No Drawings

ANTI-REFLECTIVE COATING FORMING COMPOSITION CONTAINING POLYAMIC ACID

TECHNICAL FIELD

The present invention relates to an anti-reflective coating forming composition used in a lithography process of the manufacture of semiconductor devices, and a method for forming photoresist pattern by use of the anti-reflective coating forming composition. More specifically, the present invention relates to an anti-reflective coating forming composition for forming an anti-reflective coating that can be developed with an alkaline developer for photoresist, and a method for forming photoresist pattern comprising simultaneously developing a photoresist and an anti-reflective coating, by use of the anti-reflective coating forming composition.

BACKGROUND ART

In the manufacture of semiconductor devices, micro-processing by lithography using a photoresist has been carried out. The micro-processing is a processing method comprising forming a thin film of a photoresist on a semiconductor substrate such as a silicon wafer or the like, irradiating actinic rays such as ultraviolet rays through a mask pattern on which a pattern for a device is depicted, developing it to obtain a photoresist pattern, and etching the substrate using the photoresist pattern as a protective film, thereby forming fine unevenness corresponding to the pattern on the surface of the substrate. On the other hand, in recent progress: in high integration of devices, there has been a tendency that shorter wavelength actinic rays are being used, i.e., ArF excimer laser beam (193 nm) has been taking the place of KrF excimer laser beam (248 nm). However, in these photolithography processes, there occurs a problem that dimension accuracy of the photoresist pattern is lowered by an influence of standing wave due to reflection of exposure light from the substrate or an influence of random reflection of exposure light due to unevenness on the substrate. Accordingly, it has been widely studied to provide an anti-reflective coating between the photoresist and the substrate (Bottom Anti-Reflective Coating, BARC) in order to resolve the problem.

These anti-reflective coatings are often formed by use of a heat crosslinking composition in order to prevent intermixing with a photoresist applied thereon. Thus, the resulting anti-reflective coatings become insoluble in developers for photoresist and the removal of the anti-reflective coatings prior to semiconductor substrate processing is required to be carried out by dry etching (see, for example Patent Document 1). However, the photoresist is removed simultaneously with the removal of the anti-reflective coating by dry etching. Therefore, there causes a problem that it becomes difficult to secure film thickness of the photoresist required for substrate processing. This becomes a very serious problem in case where thin photoresists are used for the purpose of improvement in developing property.

In addition, an ion implantation in the manufacture of semiconductor devices is a process for introducing impurities into a semiconductor substrate by use of a photoresist pattern as a template, and in order to avoid providing damage on the surface of the substrate, pattern formation of photoresist cannot be performed by dry etching process. Therefore, anti-reflective coating requiring removal by dry etching could not be formed as an underlayer of photoresist in photoresist pattern formation for ion implantation. The conventional photoresist pattern used as a template in the ion implantation process has a wide line-width and thereby was little affected by an influence of standing wave due to reflection of exposure light from the substrate or an influence of random reflection of exposure light due to unevenness on the substrate. Thus, problems by reflection have been resolved by use of a dye-containing photoresist or an anti-reflective coating as an upper layer of photoresist. However, with the recent miniaturization, a fine pattern begins to be required also for photoresist used in ion implantation process, and an anti-reflective coating as an underlayer of photoresist is being required.

Under these circumstances, it has been desired to develop an anti-reflective coating that can be dissolved in a developer for photoresist and removed simultaneously with photoresist by development. On the other hand, anti-reflective coatings that can be removed simultaneously with photoresist by development have been studied until now (see, for example Patent Documents 2, 3, 4, 5 and 6). However, they were not enough in applicability for fine processing, formed pattern form, and the like.

Patent Document 1: U.S. Pat. No. 6,156,479 (2000)

Patent Document 2: JP Patent No. 2686898 (1997)

Patent Document 3: JP-A-9-78031 (1997)

Patent Document 4: JP-A-11-72925 (1999)

Patent Document 5: WO 03/057678 pamphlet

Patent Document 6: WO 03/058345 pamphlet

DISCLOSURE OF INVENTION

Problem to be Solved by Invention

The present invention is made taking the above-mentioned circumstances into account, and it is an object to provide an anti-reflective coating that is soluble in a developer for photoresist and a composition for forming the anti-reflective coating. That is, the object of the present invention is to provide an anti-reflective coating forming composition used in the manufacture of semiconductor devices, and to provide an anti-reflective coating that causes no intermixing with a photoresist applied and formed thereon, dissolves in a developer for photoresist and is able to be removed simultaneously with photoresist by developing, and an anti-reflective coating forming composition for forming the anti-reflective coating. In addition, an object of the present invention is to provide a method for forming photoresist pattern used in manufacture of semiconductor devices by use of the anti-reflective coating forming composition.

Means for Solving Problem

The present invention relates to the following aspects:

as a first aspect, an anti-reflective coating forming composition comprising a polyamic acid having a structure of formula (1):

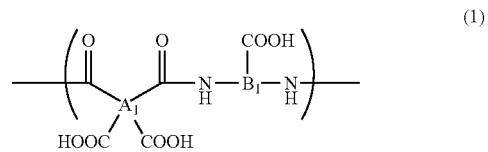

wherein $A_1$ is a tetravalent organic group, and $B_1$ is a trivalent organic group, a compound containing at least two epoxy groups, and a solvent;

as a second aspect, an anti-reflective coating forming composition comprising a polyamic acid having a structure of formula (1) and a structure of formula (2):

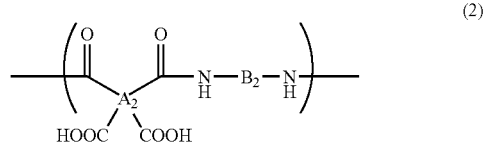

(2)

wherein $A_2$ is a tetravalent organic group, and $B_2$ is a divalent organic group, a compound containing at least two epoxy groups, and a solvent;

as a third aspect, the composition for forming anti-reflective coating as described in the first aspect, wherein the polyamic acid is a polyamic acid produced from (a) a tetracarboxylic dianhydride compound and (b) a diamine compound having at least one carboxyl group;

as a fourth aspect, the composition for forming anti-reflective coating as described in the second aspect, wherein the polyamic acid is a polyamic acid produced from (a) a tetracarboxylic dianhydride compound, (b) a diamine compound having at least one carboxyl group, and (c) a diamine compound;

as a fifth aspect, the composition for forming anti-reflective coating as described in the third or fourth aspect, wherein the tetracarboxylic dianhydride compound (a) is a tetracarboxylic dianhydride compound having at least one benzene ring structure;

as a sixth aspect, the composition for forming anti-reflective coating as described in the third or fourth aspect, wherein the diamine compound having at least one carboxyl group (b) is a diamine compound having at least one benzene ring structure;

as a seventh aspect, the composition for forming anti-reflective coating as described in the fourth aspect, wherein the diamine compound (c) is a diamine compound having two benzene ring structures;

as an eighth aspect, the composition for forming anti-reflective coating as described in the first or second aspect, wherein the polyamic acid has a weight average molecular weight of 1000 to 50000;

as a ninth aspect, the composition for forming anti-reflective coating as described in the first or second aspect, wherein the compound having at least two epoxy groups is a compound having three epoxy groups;

as a tenth aspect, the composition for forming anti-reflective coating as described in any one of the first to ninth aspects, further containing a light absorbing compound;

as an eleventh aspect, the composition for forming anti-reflective coating as described in any one of the first to tenth aspects, further containing a photoacid generator;

as a twelfth aspect, an anti-reflective coating formed by coating the anti-reflective coating forming composition as described in any one of the first to eleventh aspects on a semiconductor substrate, and baking it, and having a dissolution speed of 0.2 nm to 40 nm per second;

as a thirteenth aspect, a method of forming a photoresist pattern used in a manufacture of a semiconductor device, comprising the steps of:

coating the anti-reflective coating forming composition as described in any one of the first to eleventh aspects on a semiconductor substrate and baking it to form an anti-reflective coating, forming a photoresist layer on the anti-reflective coating, exposing the semiconductor substrate covered with the anti-reflective coating and the photoresist layer to light, and developing the exposed semiconductor substrate; and as a fourteenth aspect, the method of forming a photoresist pattern as described in the thirteenth aspect, wherein the exposure is carried out with light having a wavelength of 248 nm or 193 nm.

EFFECT OF INVENTION

The use of the anti-reflective coating forming composition according to the present invention makes possible to form an anti-reflective coating that causes no intermixing with a photoresist, dissolves in a developer for photoresist and is able to be removed simultaneously with photoresist by developing. As the anti-reflective coating formed from the anti-reflective coating forming composition according to the present invention can be removed without carrying out dry etching, it can be used in a manufacture process of semiconductor devices containing steps sensitive to damages on substrate surface by dry etching, such as ion implantation process or the like. Further, when the anti-reflective coating is formed by use of the anti-reflective coating forming composition, dissolution speed of the anti-reflective coating in a developer for photoresist can be altered by changing baking condition in the formation thereof.

BEST MODE FOR CARRYING OUT THE INVENTION

The anti-reflective coating forming composition of the present invention comprises a polyamic acid having a structure of formula (1), a compound having at least two epoxy groups, and a solvent. In addition, the anti-reflective coating forming composition of the present invention comprises a polyamic acid having a structure of formula (1) and a structure of formula (2), a compound having at least two epoxy groups, and a solvent. The anti-reflective coating forming composition of the present invention comprises further a light absorbing compound, a surfactant and a photoacid generator, and the like.

The proportion of solid content in the anti-reflective coating forming composition according to the present invention is not specifically limited so long as each component is homogeneously dissolved, but for example 0.5 to 50 mass %, for example 1 to 30 mass %, or for example 5 to 25 mass %. In the specification, the solid content means all components in the anti-reflective coating forming composition from which the solvent component is excluded.

The anti-reflective coating forming composition of the present invention is concretely described.

<Polyamic Acid>

The anti-reflective coating forming composition of the present invention contains a polyamic acid having a structure of formula (1), or a polyamic acid having a structure of formula (1) and a structure of formula (2).

In formula (1), $A_1$ is a tetravalent organic group, and $B_1$ is a trivalent organic group. $A_1$ includes for example groups of formulae (3) to (10) wherein X is $C_{1-5}$ alkyl group, chlorine atom, bromine atom, fluorine atom, $C_{1-5}$ alkoxy group, hydroxyl group, carboxyl group, phenoxy group, trifluoromethyl group or nitro group, m, is a number of 0, 1 or 2.

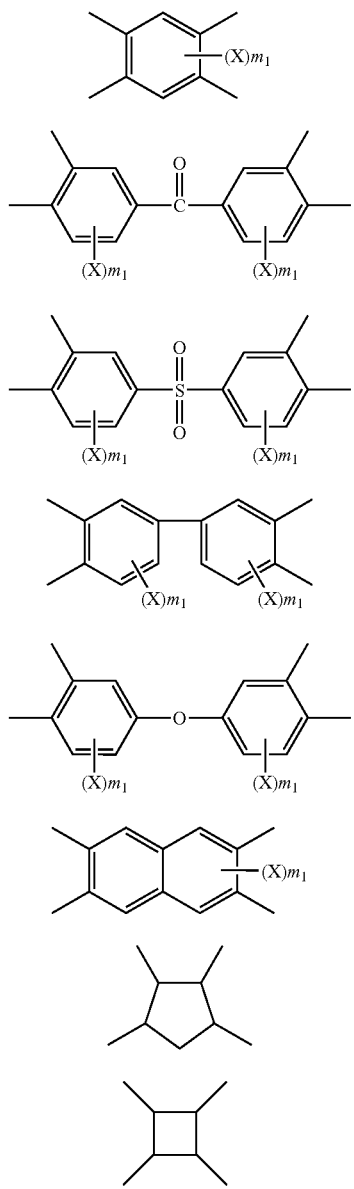

$C_{1-5}$alkyl group includes methyl group, ethyl group, isopropyl group, cyclopentyl group, and n-pentyl group, and the like. $C_{1-5}$alkoxy group includes methoxy group, ethoxy group, isopropoxy group, cyclopentyloxy group and n-pentyloxy group, and the like.

$B_1$ includes for example groups of formulae (11) to (18) wherein Y is $C_{1-5}$alkyl group, chlorine atom, bromine atom, fluorine atom, $C_{1-5}$alkoxy group, hydroxyl group, carboxyl group, phenoxy group, trifluoromethyl group or nitro group, $m_2$ is a number of 0, 1 or 2.

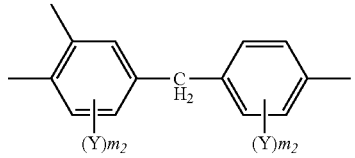

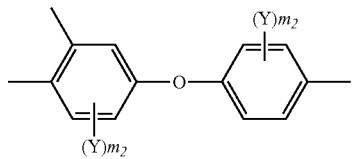

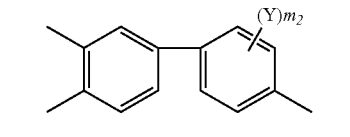

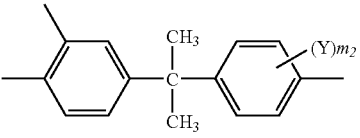

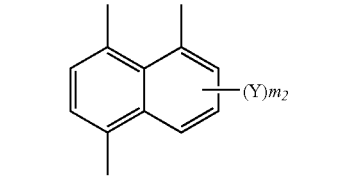

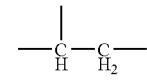

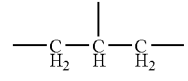

In formula (2), $A_2$ is a tetravalent organic group, and $B_2$ is a divalent organic group. $A_2$ includes for example groups of formulae (3) to (10). $B_2$ includes for example groups of formulae (19) to (27) wherein Z is $C_{1-5}$alkyl group, chlorine atom, bromine atom, fluorine atom, $C_{1-5}$alkoxy group, hydroxyl group, carboxyl group, phenoxy group, trifluoromethyl group or nitro group, $m_3$ is a number of 0, 1 or 2.

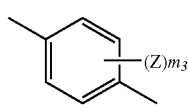

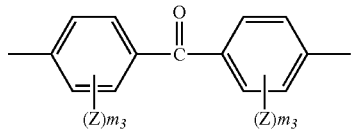

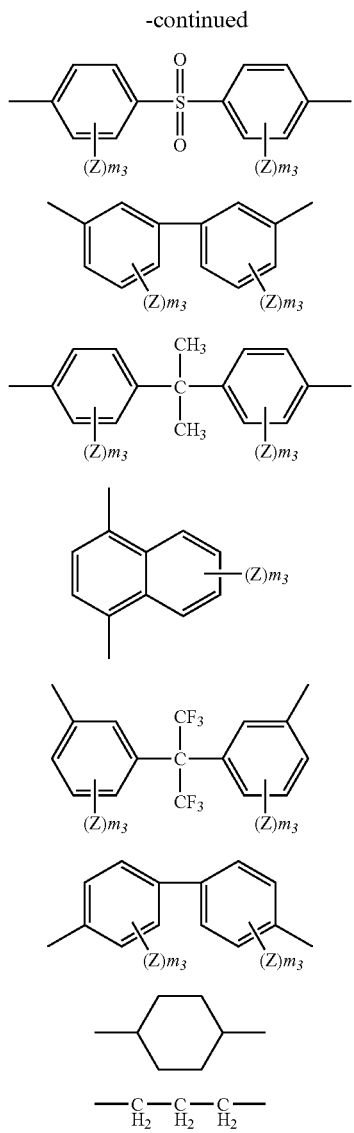

The polyamic acid used in the present invention has a weight average molecular weight of for example 1000 to 100000, or 1000 to 50000, or 2000 to 30000, or 5000 to 10000 in terms of polystyrene. In case where the weight average molecular weight is less than 1000, the resulting anti-reflective coating is increased in a solubility in a solvent used for photoresist, and a result of it, an intermixing with the photoresist often occurs. In case where the weight average molecular weight is more than 100000, the resulting anti-reflective coating becomes insufficient in solubility in a developer for photoresist, and residue after development is often present.

The process for obtaining the polyamic acid contained in the anti-reflective coating forming composition according to the present invention is not specifically limited, and the compound can be produced according to a known process. For example, the polyamic acid can be produced by a reaction or polymerization of a diamine compound with tetracarboxylic acid or a tetracarboxylic dianhydride compound being the derivative thereof, or dicarboxylic acid dihalide, etc. In addition, a polyamic acid silyl ester is synthesized by a polymerization by use of bis-silylated diamine compound and a tetracarboxylic dianhydride compound, and then a polyamic acid can be produced by decomposing the silyl ester moiety by an acid.

The polyamic acid contained in the anti-reflective coating forming composition according to the present invention can be produced from (a) a tetracarboxylic dianhydride compound and (b) a diamine compound having at least one carboxyl group. In addition, the polyamic acid can be produced from (a) a tetracarboxylic dianhydride compound, (b) a diamine compound having at least one carboxyl group, and (c) a diamine compound.

The tetracarboxylic dianhydride compound (a) used for the preparation of the polyamic acid used in the present invention is not specifically limited. The tetracarboxylic dianhydride compound (a) may be used alone or may be used in a mixture of two or more. Concrete examples are aromatic tetracarboxylic dianhydrides such as pyromellitic dianhydride, 3,3',4,4'-diphenyl tetracarboxylic dianhydride, 3,3',4,4'-benzophenone tetracarboxylic dianhydride, 3,3',4,4'-diphenylether tetracarboxylic dianhydride, 4,4'-(hexafluoroisopropylidene)diphthalic dianhydride and 3,3',4,4'-diphenylsulfone tetracarboxylic dianhydride, etc., alicyclic tetracarboxylic dianhydrides such as 1,2,3,4-cyclobutane tetracarboxylic dianhydride, 1,2-dimethyl-1,2,3,4-cyclobutane tetracarboxylic dianhydride, 1,2,3,4-tetramethyl-1,2,3,4-cyclobutane tetracarboxylic dianhydride, 1,2,3,4-cyclopentane tetracarboxylic dianhydride, 1,2,3,4-cyclohexane tetracarboxylic dianhydride, and 3,4-dicarboxy-1,2,3,4-tetrahydro-1-naphthalene succinic dianhydride, etc., aliphatic tetracarboxylic dianhydrides such as 1,2,3,4-butane tetracarboxylic dianhydride, etc.

The diamine compound having at least one carboxyl group (b) used for the preparation of the polyamic acid used in the present invention is not specifically limited. The diamine compound having at least one carboxyl group (b) may be used alone or may be used in a mixture of two or more. Concrete examples are 2,4-diaminobenzoic acid, 2,5-diaminobenzoic acid, 3,5-diaminobenzoic acid, 4,6-diamino-1,3-benzene dicarboxylic acid, 2,5-diamino-1,4-benzene dicarboxylic acid, bis(4-amino-3-carboxyphenyl)ether, bis(4-amino-3,5-dicarboxyphenyl)ether, bis(4-amino-3-carboxyphenyl)sulfone, bis(4-amino-3,5-dicarboxyphenyl)sulfone, 4,4'-diamino-3,3'-dicarboxy biphenyl, 4,4'-diamino-3,3'-dicarboxy-5,5'-dimethylbiphenyl, 4,4'-diamino-3,3'-dicarboxy-5,5'-dimethoxybiphenyl, 1,4-bis(4-amino-3-carboxyphenyl)benzene, 1,3-bis(4-amino-3-carboxyphenoxy) benzene, bis[4-(4-amino-3-carboxyphenoxy)phenyl]sulfone, bis[4-(4-amino-3-carboxyphenoxy)phenyl]propane and 2,2-bis[4-(4-amino-3-carboxyphenoxy)phenyl]hexafluoropropane and the like.

In addition, the diamine compound (c) used for the preparation of the polyamic acid used in the present invention is not specifically limited. The diamine compound (c) may be used alone or may be used in a mixture of two or more. Concrete examples are diamine compounds having phenolic hydroxyl group such as 2,4-diaminophenol, 3,5-diaminophenol, 2,5-diaminophenol, 4,6-diaminoresorcinol, 2,5-diaminohydroquinone, bis(3-amino-4-hydroxyphenyl) ether, bis(4-amino-3-hydroxyphenyl) ether, bis(4-amino-3,5-dihydroxyphenyl) ether, bis(3-amino-4-hydroxyphenyl) methane, bis(4-amino-3-hydroxyphenyl) methane, bis(4-amino-3,5-dihydroxyphenyl) methane, bis(3-amino-4-hydroxyphenyl) sulfone, bis(4-amino-3-hydroxyphenyl) sulfone, bis(4-amino-3,5-dihydroxyphenyl) sulfone, 2,2-bis(3-amino-4-hydroxyphenyl) hexafluoropropane, 2,2-bis(4-amino-3-hydroxyphenyl) hexafluoropropane, 2,2-bis(4-amino-3,5-dihydroxyphenyl) hexafluoropropane, 4,4'-diamino-3,3'- dihydroxybiphenyl, 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy) benzene, 1,3-bis(3-amino-4-hydroxyphenoxy) benzene, 1,4-bis(4-amino-3-hydroxyphenoxy) benzene, 1,3-bis(4-amino-3-hydroxyphenoxy) benzene, bis[4-(3-amino-4-hydroxyphenoxy)phenyl]sulfone, bis[4-(3-amino-4-hydroxyphenoxy)phenyl]propane and 2,2-bis[4-(3-amino-4-hydroxyphenoxy)phenyl]hexafluroropropane, etc., diamine compounds having thiophenol group such as 1,3-diamino-4-mercaptobenzene, 1,3-diamino-5-mercaptobenzene, 1,4-diamino-2-mercaptobenzene, bis(4-amino-3-mercaptophenyl) ether, and 2,2-bis(3-amino-4-mercaptophenyl) hexafluoropropane, etc., diamine compounds having sulfonic acid group such as 1,3-diaminobenzene-4-sulfonic acid, 1,3-diaminobenzene-5-sulfonic acid, 1,4-diaminobenzene-2-sulfonic acid, bis(4-amino-3-sulfophenyl) ether, 4,4-diaminobiphenyl-3,3'-disulfonic acid, and 4,4'-diamino-3,3'-dimethylbiphenyl-6,6'-disulfonic acid, etc., diamine compounds having carboxylate group such as 3,5-diaminobenzoic acid-tert-butyl ester, 3,5-diaminobenzoic acid-ethoxymethyl ester, 3,5-diaminobenzoic acid methyl ester, 3,5-diaminobenzoic acid n-propyl ester, and 3,5-diaminobenzoic acid isobutyl ester, etc. In addition, the diamine compounds include p-phenylene diamine, m-phenylene diamine, 4,4'-methylene-bis(2,6-diethyleneaniline), 4,4'-methylene-bis(2-isopropyl-6-methylaniline) 4,4'-methylene-bis(2,6-diisopropylaniline), 2,4,6-trimethyl-1,3-phenylenediamine, 2,3,5,6-tetramethyl-1,4-phenylenediamine, o-tolydine, m-tolydine, 3,3',5,5'-tetramethylbenzidine, bis[4-(3-aminophenoxy)phenyl]sulfone, 2,2-bis[4-(3-aminophenoxy)phenyl]propane, 2,2-bis[4-(3-aminophenoxy)phenyl]hexafluoropropane, 4,4'-diamino-3,3'-dimethyldicyclohexylmethane, 4,4'-diaminodiphenyl ether, 3,4-diaminodiphenyl ether, 4,4'-diaminodiphenylmethane, 2,2-bis(4-anilino)hexafluoropropane, 2,2-bis(3-anilino)hexafluoropropane, 2,2-bis(3-amino-4-toluyl)hexafluoropropane, 1,4-bis(4-aminophenoxy)benzene, 1,3-bis(4-aminophenoxy)benzene, bis[4-(4-aminophenoxy)phenyl]sulfone, 2,2-bis[4-(4-aminophenoxy)phenyl]propane, and 2,2-bis[4-(4-aminophenoxy)phenyl]hexafluoropropane, etc.

When (b) a diamine compound having at least one carboxyl group, and (c) a diamine compound are used in the production of the polyamic acid contained in the present invention, the proportion of (b) the diamine compound having at least one carboxyl group in all diamine compounds is for example 1 to 99 mass %, or for example 5 to 80 mass %, or 10 to 60 mass %, or 20 to 50 mass %. If the proportion of (b) the diamine compound having at least one carboxyl group is lower than the lower limit, the solubility of the formed anti-reflective coating in the developer for photoresist becomes insufficient.

When the polyamic acid used in the present invention is produced from (a) a tetracarboxylic dianhydride compound and (b) a diamine compound having at least one carboxyl group, or (a) a tetracarboxylic dianhydride compound, (b) a diamine compound having at least one carboxyl group, and (c) a diamine compound, it is desirable that the ratio of total number of moles of the diamine compound and total number of moles of the tetracarboxylic dianhydride compound is 0.8 to 1.2. Similarly to ordinary polycondensation, the degree of the polymerization of the resulting polyamic acid becomes high and the molecular weight is increased as the molar ratio approaches 1.

In the production of the polyamic acid, the reaction temperature between the diamine compound and the tetracarboxylic dianhydride compound can be arbitrarily selected form a region of −20° C. to 150° C., preferably −5° C. to 100° C. A polyamic acid having a high molecular weight can be obtained at a reaction temperature of 5° C. to 40° C. for a reaction time of 1 to 48 hours. For obtaining a polyamic acid having a low molecular weight and a high shelf stability, a reaction time of 10 hours or more at 40° C. to 80° C. is more preferable. ratio approaches 1.

The reaction between the diamine compound and the tetracarboxylic dianhydride compound can be carried out in a solvent. The solvent used in this case includes N,N-dimethylformamide, N,N-dimethylacetamide, N-methylpyrrolidone, N-vinylpyrrolidone, N-methylcaprolactam, dimethylsulfoxide, tetramethyl urea, pyridine, dimethylsulfone, hexamethylsulfoxide, m-cresol, γ-butyrolactone, ethyl acetate, butyl acetate, ethyl lactate, methyl 3-methoxypropionate, methyl 2-methoxypropionate, ethyl 2-methoxypropionate, ethyl 3-ethoxypropionate, ethyl 2-ethoxypropionate, ethylene glycol dimethyl ether, diethylene glycol dimethyl ether, diethylene glycol diethyl ether, diethylene glycolmethyl ethyl ether, propylene glycol dimethyl ether, dipropylene glycol dimethyl ether, ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether, dipropylene glycol monoethyl ether, propylene glycol monomethyl ether acetate, carbitol acetate, ethyl cellosolve, cylcohexanone, methyl ethyl ketone, methyl isobutyl ketone, and 2-heptanone, etc. These solvents can be used alone or in a mixture. Further, a solvent that does not dissolve any polyamic acid can be used by mixing with the above-mentioned solvent in an amount that the polyamic acid produced by polymerization does not precipitate.

The solution containing the polyamic acid obtained as mentioned above can be used for the preparation of the anti-reflective coating forming composition as such. In addition, the polyamic acid can be precipitated in poor solvents such as methanol, ethanol or the like, and isolated, and the recovered polyamic acid can be used.

The polyamic acid contained in the anti-reflective coating forming composition of the present invention is preferably a polyamic acid basically consisting of the structure of formula (1), or a polyamic acid basically consisting of the structure of formula (1) and the structure of formula (2), except the terminal moiety.

The polyamic acid contained in the anti-reflective coating forming composition of the present invention includes for example polyamic acids (29) to (41) mentioned below. In the formulae, $p_1$, $p_2$, $p_3$ and $p_4$ are a proportion of each structure in the polyamic acid. (29) to (36) are polyamic acids produced from one tetracarboxylic dianhydride compound and two diamine compounds, and (37) and (38) are polyamic acids produced from two tetracarboxylic dianhydride compounds and one diamine compound, (39) is polyamic acid produced from two tetracarboxylic dianhydride compounds and two diamine compounds, and (40) and (41) are polyamic acids produced from one tetracarboxylic dianhydride compound and one diamine compound.

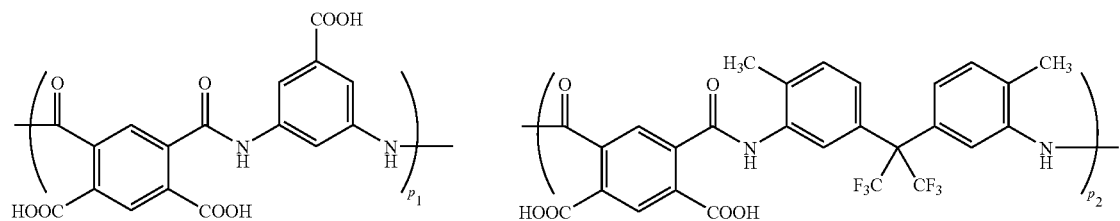
(29)
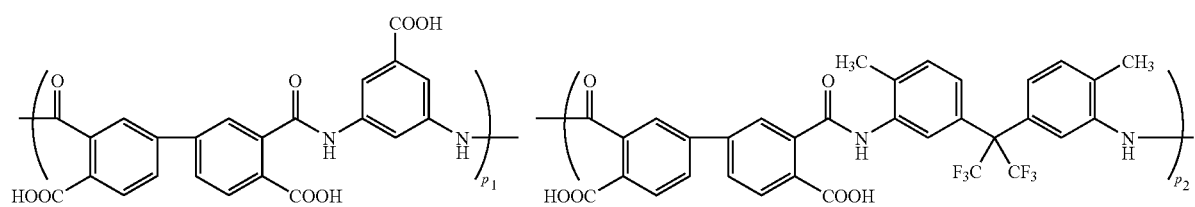
(30)
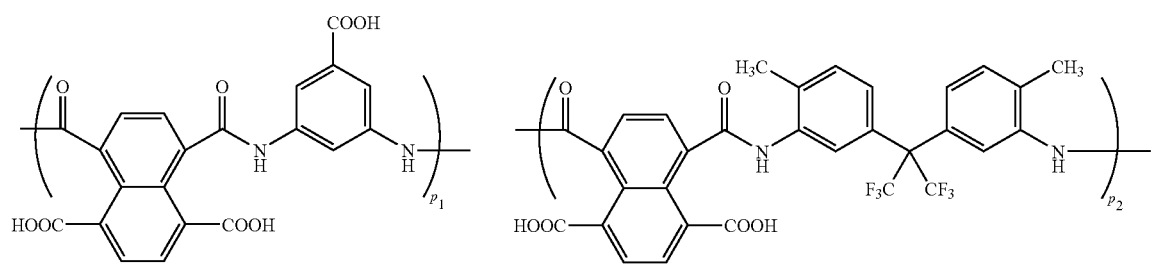
(31)
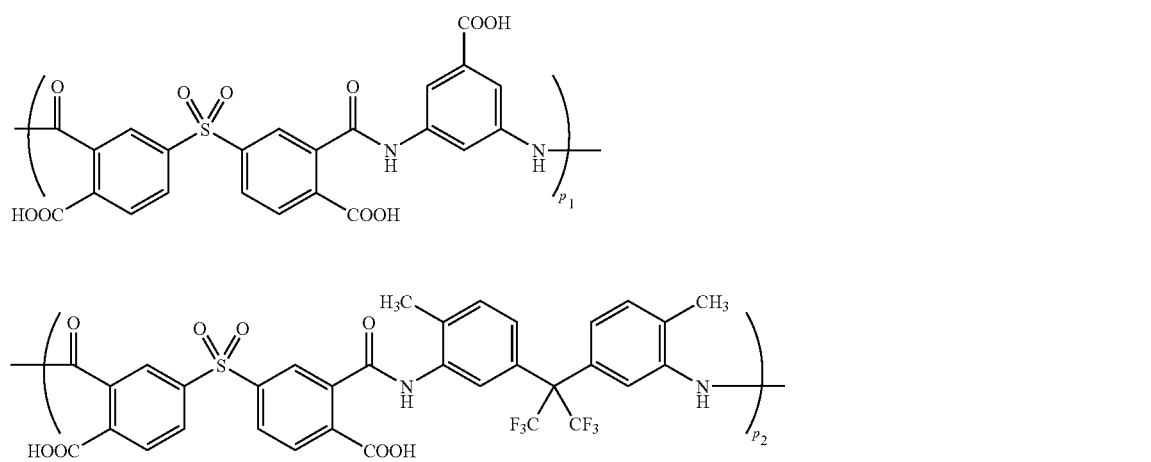
(32)
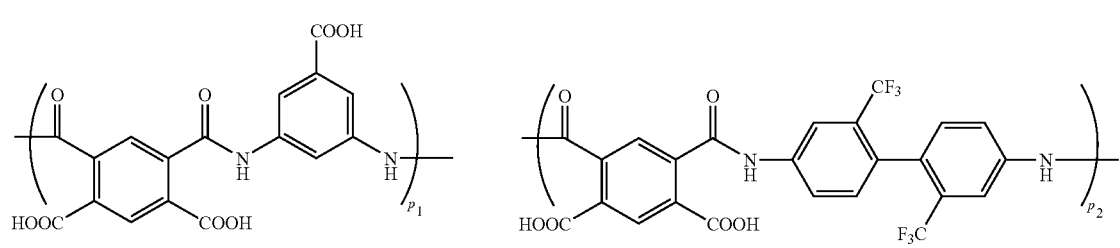
(33)

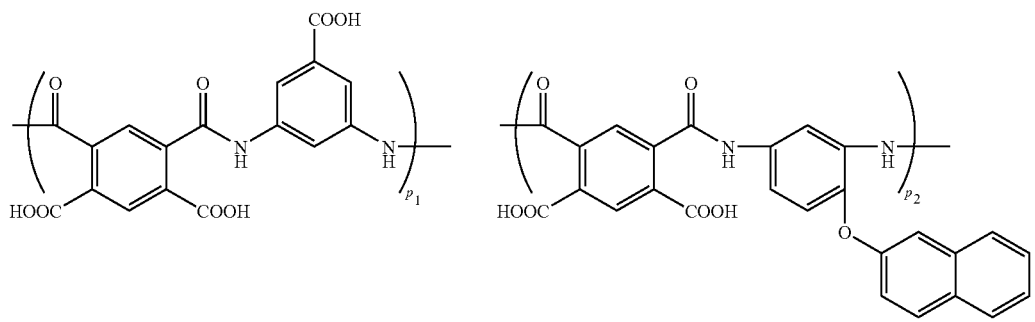
(34)
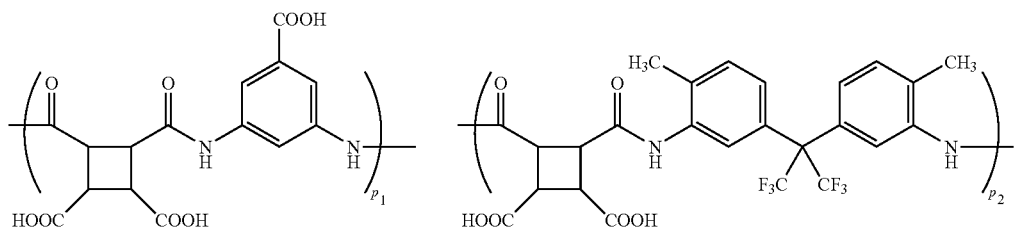
(35)
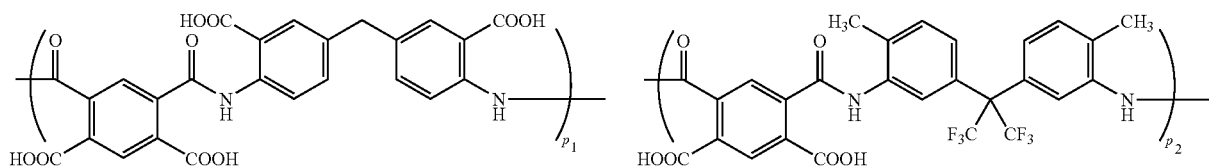
(36)
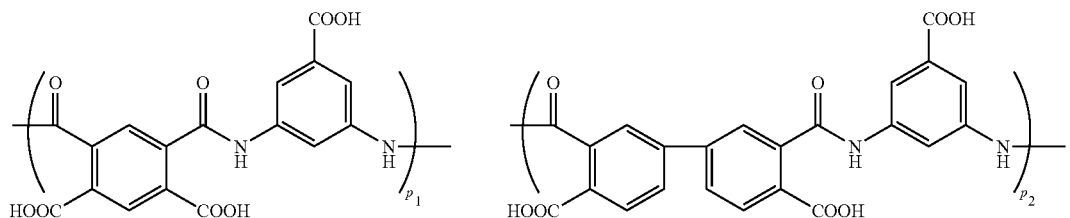
(37)
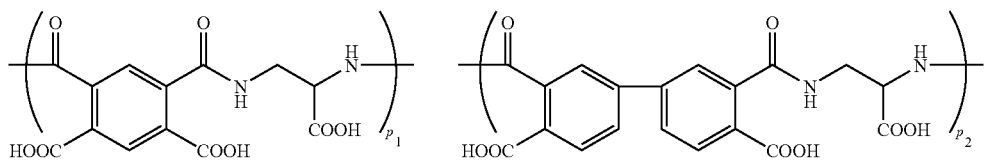
(38)
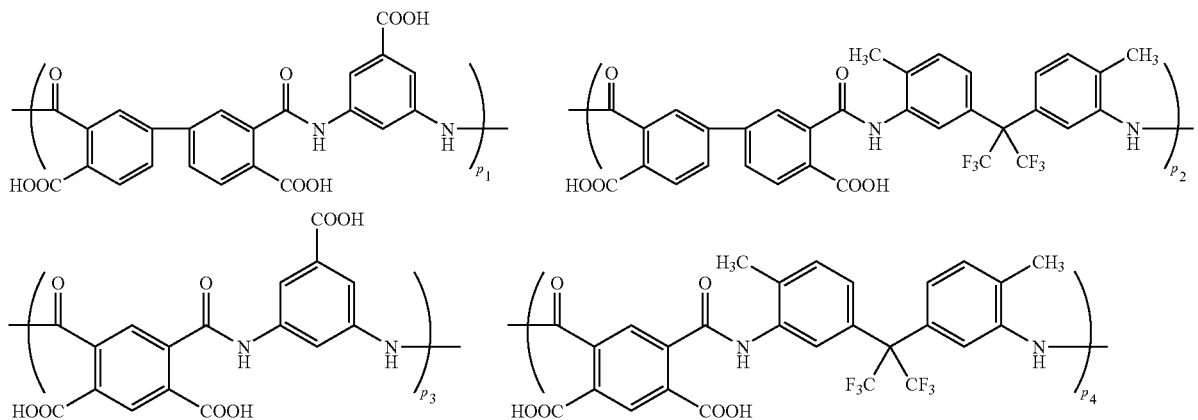
(39)

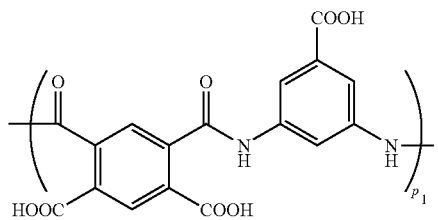 (40)

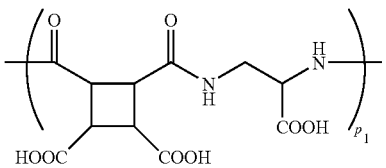 (41)

<Compound Containing at Least Two Epoxy Groups>

The anti-reflective coating forming composition of the present invention contains a compound containing at least two epoxy groups. The compound is not specifically limited so long as the compound contains epoxy groups. The compound includes for example, tris(2,3-epoxypropyl) isocyanurate, 1,4-butanediol diglycidyl ether, 1,2-epoxy-4-(epoxyethyl) cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexane dicarboxylic acid diglycidyl ester, 4,4'-methylene bis (N,N-diglycidylaniline), 3,4-epoxycyclohexylmethyl-3,4-epoxycyclohexane carboxylate, trimethylol ethane triglycidyl ether and bisphenol-A-diglycidyl ether, and pentaerythritol polyglycidyl ether, and the like.

As a compound containing at least two epoxy groups, polymers having epoxy groups can be used. The polymers can be used without any specific limit so long as they contain epoxy groups. The polymers can be produced by addition polymerization with addition polymerizable monomer having epoxy group, or by a reaction of a polymer having hydroxyl group with a compound containing epoxy group such as epichlorohydrin, glycidyltosylate or the like. For example, polyglycidyl acrylate, addition polymerized polymers such as a copolymer of glycidylmethacrylate and ethylmethacrylate, a copolymer of glycidylmethacrylate, styrene and 2-hydroxyethylmethacrylate, etc., and condensation polymerized polymers such as epoxy novolak, etc. can be mentioned. The weight average molecular weight of the polymers is for example 300 to 200000.

The compound containing at least two epoxy groups also includes epoxy resins having amino group such as YH-434, YH-434L (manufactured by Tohto Kasei Co., Ltd.), etc., epoxy resins having cyclohexene oxide structure such as Epoleed GT-401, GT-403, GT-301, GT-302, Ceroxide 2021, Ceroxide 3000 (manufactured by Daicel chemical Industries, Ltd.), etc., bisphenol A type epoxy resins such as Epicoat 1001, 1002, 1003, 1004, 1007, 1009, 1010, 828 (manufactured by Yuka-Shell Epoxy Co., Ltd.), etc., bisphenol F type epoxy resins such as Epicoat 807 (manufactured by Yuka-Shell Epoxy Co., Ltd.), etc., phenol novolak type epoxy resins such as Epicoat 152, 154 (manufactured by Yuka-Shell Epopxy Co., Ltd.), EPPN 201, 202 (manufactured by Nippon Kayaku Co., Ltd.), etc., cresol novolak type epoxy resins such as EOCN-102, EOCN-103S, EOCN-104S, EOCN-1020, EOCN-1025, EOCN-1027 (manufactured by Nippon Kayaku Co., Ltd.), Epicoat 180S75 (manufactured by Yuka-Shell Epoxy Co., Ltd.), etc., alicyclic epoxy resins such as Denacol EX-252 (manufactured by Nagase ChemteX Corporation), CY175 CY177, CY179 (manufactured by CIBA-GEIGY A.G.), Araldite CY-182, CY-192, CY-184 (manufactured by CIBA-GEIGY A.G.), Epichlone 200, 400 (manufactured by Dainippon Ink and Chemicals Incorporated), Epicoat 871, 872 (manufactured by Yuka-Shell Epoxy Co., Ltd.), ED-5661, ED-5662 (manufactured by Celanese Coating Co., Ltd.), etc., aliphatic polyglycidyl ether such as Denacol EX-611, EX-612, EX-614, EX-622, EX-411, EX-512, EX-522, EX-421, EX-313, EX-314, EX-321 (manufactured by Nagase ChemteX Corporation), etc.

The content amount of the compound containing at least two epoxy groups is for example 5 to 70 mass parts, or 10 to 60 mass parts, preferably 15 to 45 mass parts based on 100 mass parts of the polyamic acid. If the content amount of the compound containing at least two epoxy groups is less than 5 mass parts, the resulting anti-reflective coating is deficient in degree of cure, and may be dissolved in a photoresist-solvent and cause intermixing. If the content amount of the compound containing at least two epoxy groups is more than 70 mass parts, a sufficient solubility for developer for photoresist may be acquired.

<Solvent>

The anti-reflective coating forming composition according to the present invention can be easily prepared by homogeneously mixing the above-mentioned components and is dissolved in a suitable solvent and used in a state of solution. The solvent includes for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methQxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone, etc. These solvents may be used singly or in combination of two or more of them. Further, high boiling solvents such as propylene glycol monobutyl ether or propylene glycol monobutyl ether acetate, etc. may be mixed and used.

It is preferable that the anti-reflective coating forming composition solution prepared as mentioned above is filtered through a filter having a bore size of ca. 0.2 μm and used. The anti-reflective coating forming composition solution prepared as mentioned above is excellent also in shelf stability at room temperature.

The above-mentioned anti-reflective coating forming composition according to the present invention can contain a light absorbing compound, a photoacid generator and a surfactant, and the like, in addition to the above-mentioned polyamic acid, compound containing at least two epoxy groups and solvent.

The light absorbing compounds are not specifically limited so long as they have an absorption for light used in exposure to light. Compounds having an aromatic ring structure such as anthracene ring, naphthalene ring, benzene ring, quinoline ring and triazine ring, etc. are preferably used. In addition, from a viewpoint that it does not inhibit solubility in developer for photoresist of the anti-reflective coating, compounds having phenolic hydroxyl group, carboxyl group or sulfonic acid group are preferably used. Compounds having anthracene ring naphthalene ring substituted by phenolic hydroxyl group or carboxyl group are preferably used.

The light absorbing compounds having a high absorption for light of a wavelength 248 nm include for example 1-naphthoic acid, 2-naphthoic acid, 1-naphthol, 2-naphthol, 1-aminonaphthalene, 1-hydroxy-2-naphthoic acid, 3-hydroxy-2-naphthoic acid, 3,7-dihydroxy-2-naphthoic acid, 6-bromo-2-hydroxynaphthalene, 1,2-naphthalene dicarboxylic acid, 1,3-naphthalene dicarboxylic acid, 1,4-naphthalene dicarboxylic acid, 1,5-naphthalene dicarboxylic acid, 1,6-naphthalene dicarboxylic acid, 1,7-naphthalene dicarboxylic acid, 1,8-naphthalene dicarboxylic acid, 2,3-naphthalene dicarboxylic acid, 2,6-naphthalene dicarboxylic acid, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, 6-hydroxy-1-naphthoic acid, 1-hydroxy-2-naphthoic acid, 3-hydroxy-2-naphthoic acid, 6-hydroxy-2-naphthoic acid, 1-bromo-2-hydroxy-3-naphthoic acid, 1-bromo-4-hydroxy-3-naphthoic acid, 1,6-dibromo-2-hydroxy-3-naphthoic acid, 3-hydroxy-7-methoxy-2-naphthoic acid, 1-amino-2-naphthol, 1,5-dimercaptonaphthalene, 1,4,5,8-naphthalene tetracarboxylic acid, 3,5-dihydroxy-2-naphthoic acid, 1,4-dihydroxy-2-naphthoic acid, 2-ethoxy-1-naphthoic acid, 2,6-dichloro-1-naphthol, 2-hydroxy-3-naphthalene carboxylic acid methyl ester, 6-hydroxy-2-naphthalene carboxylic acid methyl ester, 3-hydroxy-7-methoxy-2-naphthalene carboxylic acid methyl ester, 3,7-dihydroxy-2-naphthalene carboxylic acid methyl ester, 2,4-dibromo-1-naphthol, 1-bromo-2-naphthol, 2-naphthalene thiol, 4-methoxy-1-naphthol, 6-acetoxy-2-naphthoic acid, 1,6-dibromo-1-naphthol, 2,6-dibromo-1,5-dihydroxynaphthalene, 1-acetyl-2-naphthol, 9-anthracene carboxylic acid, 1,4,9,10-tetrahydroxyanthracene, and 1,8,9-trihydroxyanthracene, and the like.

In addition, the light absorbing compounds having a high absorption for light of a wavelength 193 nm include for example benzoic acid, 4-methylbenzoic acid, o-phthalic acid, m-phthalic acid, p-phthalic acid, 2-methoxybenzoic acid, isophthalic acid, terephthalic acid, 2-hydroxybenzoic acid, 3-hydroxybenzoic acid, 4-hydroxybenzoic acid, 2-acetoxybenzoic acid, 2-aminobenzoic acid, 3-aminobenzoic acid, 4-aminobenzoic acid, trimesic acid, 1,4-benzenedicarboxylic acid, 2,3-dimethoxybenzoic acid, 2,4-dimethoxybenzoic acid, 2,5-dimethoxybenzoic acid, 2,4-dihydroxybenzoic acid, 2,6-dihydroxybenzoic acid, 3,4-dihydroxybenzoic acid, 3,5-dihydroxybenzoic acid, 4-acetylbenzoic acid, pyromellitic acid, trimesic anhydride, 2-[bis(4-hydroxyphenyl)-methyl]benzoic acid, 3,4,5-trihydroxybenzoic acid, 2-benzophenone carboxylic acid, m-phenylbenzoic acid, 3-(4'-hydroxyphenoxy) benzoic acid, 3-phenoxybenzoic acid, phenol, 1,4-dihydroxybenzene, 1,3-dihydroxybenzene, 1,2-dihydroxybenzene, 2-methylphenol, 3-methylphenol, 4-methylphenol, 1,3,5-trihydroxybenzene, 2,2-bis-4-hydroxyphenylpropane, 2-hydroxybiphenyl, 2-aminophenol, 3-aminophenol, 4-aminophenol, 2,4,6-tris(4-hydroxyphenylmethyl)-1,3-benzenediol and 4-benzyloxyphenol, and the like.

Further, in order to prevent sublimation on baking for forming anti-reflective coating, these light absorbing compounds obtained by reacting with a polymer or a compound having one or more reactive groups can be used.

For example, in case of compounds having carboxyl group or phenolic hydroxyl group, the following compounds can be used as light absorbing compounds: compounds obtained by reacting with an epoxy compound such as tris(2,3-epoxypropyl) isocyanurate, 1,4-butanediol diglycidyl ether, 1,2-epoxy-4-(epoxyethyl) cyclohexane, glycerol triglycidyl ether, diethylene glycol diglycidyl ether, 2,6-diglycidyl phenyl glycidyl ether, 1,1,3-tris(p-(2,3-epoxypropoxy)phenyl)propane, 1,2-cyclohexane dicarboxylic acid diglycidyl ester, 4,4'-methylenebis(N,N-diglycidylaniline), 3,4-epoxycyclohexylmethyl-3,4-epoxycyclohexane carboxylate, trimethylol ethane triglycidyl ether, bisphenol-A-diglycidyl ether, and pentaerythritol polyglycidyl ether, etc., or a polymer containing a structure having epoxy group such as glycidyl methacrylate, etc. Such light absorbing compounds include for example polymers having the following unit structure of formulae (42), (43) and (44), and the compound of formula (45). In formula (45), Ar is benzene ring, naphthalene ring or anthracene ring that may be substituted by a group selected from the group consisting of $C_{1-5}$alkyl group, $C_{1-5}$alkoxy group, fluorine atom, chlorine atom, bromine atom, iodine atom, nitro group, cyano group, hydroxyl group, thiol group, $C_{1-5}$thiolkyl group, carboxyl group, phenoxy group, acetyl group, $C_{1-5}$alkoxycarbonyl group and vinyl group.

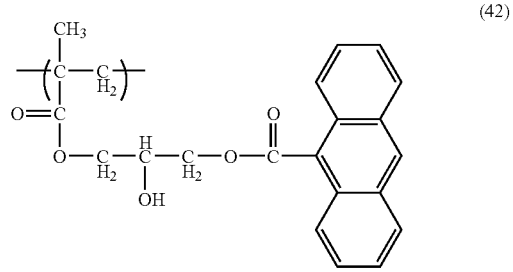

(42)

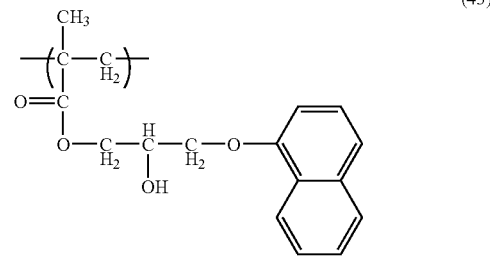

(43)

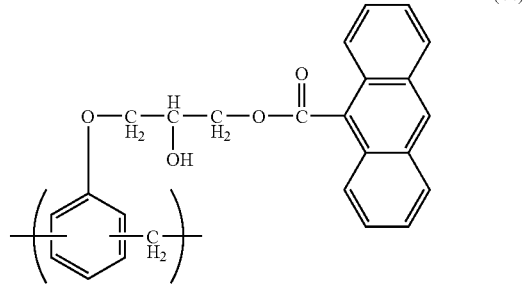

(44)

-continued

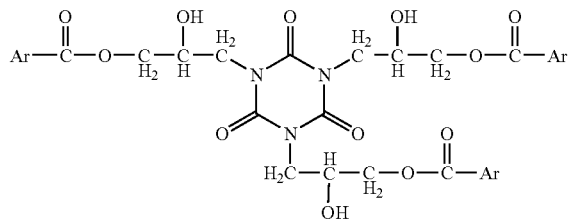
(45)

Preferable light absorbing compounds are as follows: compounds obtained by reacting the above-mentioned epoxy compound such as tris(2,3-epoxypropyl)isocyanurate and 1,4-butanediol diglycidyl ether, etc. with a naphthalene compound having two or more carboxyl groups or phenolic hydroxyl groups such as example 1-hydroxy-2-naphthoic acid, 3-hydroxy-2-naphthoic acid, 3,7-dihydroxy-2-naphthoic acid, 1,2-naphthalene dicarboxylic acid, 1,4-naphthalene dicarboxylic acid, 1,5-naphthalene dicarboxylic acid, 2,3-naphthalene dicarboxylic acid, 2,6-naphthalene dicarboxylic acid, 1,3-dihydroxynaphthalene, 1,5-dihydroxynaphthalene, 1,6-dihydroxynaphthalene, 1,7-dihydroxynaphthalene, 1,8-dihydroxynaphthalene, 2,6-dihydroxynaphthalene, 2,7-dihydroxynaphthalene, 6-hydroxy-1-naphthoic acid, 3-hydroxy-2-naphthoic acid, 1-bromo-2-hydroxy-3-naphthoic acid, 1-bromo-4-hydroxy-3-naphthoic acid, 1,6-dibromo-2-hydroxy-3-naphthoic acid, 1,4,5,8-naphthalene tetracarboxylic acid, 3,5-dihydroxy-2-naphthoic acid, and 1,4-dihydroxy-2-naphthoic acid, etc.

The reaction of the compound having carboxyl groups or phenolic hydroxyl groups with the epoxy compound or the polymer containing a structure having epoxy group can be carried out in an organic solvent such as benzene, toluene, xylene, ethyl lactate, butyl lactate, propylene glycol monomethyl ether, propylene glycol monomethyl ether acetate and N-methylpyrrolidone, etc. In this reaction, a quaternary ammonium salt such as benzyltriethylammonium chloride tetrabutylammonium chloride, and tetraethylammonium bromide, etc. can be used as a catalyst. The reaction temperature and reaction time depend on used compounds, concentration and the like, and they are suitably selected from a reaction time of 0.1 to 100 hours and a reaction temperature of 20° C. to 200° C. When the catalyst is used, it can be used in an amount of 0.001 to 30 mass % based on the whole mass the used compounds.

The above-mentioned light absorbing compounds can be used alone or in a combination of two or more compounds. When the light absorbing compounds are used, the content amount thereof is for example 1 to 300 mass parts, or 3 to 200 mass parts, or for example 5 to 100 mass parts, or 10 to 100 mass parts based on 100 mass parts of the polyamic acid. If the content amount of the light absorbing compounds is more than 300 mass parts, the solubility in developer for photoresist of an anti-reflective coating is often lowered, and the anti-reflective coating often causes intermixing with the photoresist. The alternation of the kind and content amount of the light absorbing compounds permits the control of attenuation coefficient (k) of the anti-reflective coating.

The anti-reflective coating forming composition according to the present invention can contain a photoacid generator. The photoacid generator includes onium salt compounds, sulfone imide compounds, and disulfonyl diazomethane compounds, etc.

The onium salt compounds include iodonium salt compounds such as diphenyl iodonium hexafluorophosphate, diphenyl iodonium trifluoromethane sulfonate, diphenyl iodonium nonafluoro-n-butane sulfonate, diphenyl iodonium perfluoro-n-octane sulfonate, diphenyliodonium camphor sulfonate, bis(4-t-butylphenyl)iodonium camphor sulfonate and bis(4-tert-butylphenyl)iodonium trifluoromethane sulfonate, etc., and sulfonium salt compounds such as triphenylsulfonium hexafluoroantimonate, triphenylsulfonium nonafluoro-n-butane sulfonate, triphenylsulfonium camphor sulfonate and triphenylsulfonium trifluoromethane sulfonate, etc.

The sulfone imide compounds include for example N-(trifluoromethane sulfonyloxy)succinimide, N-(nonafluoro-n-butanesulfonyloxy)succinimide, N-(camphorsulfonyloxy)succinimide and N-(trifluoromethanesulfonyloxy)naphthalimide, etc.

The disulfonyl diazomethane compounds include for example bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyl diazomethane, etc.

These photoacid generators can be used singly or in a combination of two or more. The content amount of the photoacid generator is for example 0.1 to 20 mass parts, or 0.05 to 10 mass parts, or for example 0.1 to 5 mass parts, or 0.5 to 3 mass parts based on 100 mass parts of the polyamic acid. These photoacid generators produce an acid when the photoresist is exposed to light. The addition of the photoacid generator permits the control of the acidity of the anti-reflective coating and thus the regulation of the form of the photoresist.

The anti-reflective coating forming composition according to the present invention can contain a multivalent phenol compound or a compound containing a carboxyl group in order to control dissolution speed in a developer for photoresist. Such compounds are not specifically limited, and include for example multivalent phenols such as tris-hydroxyphenylethane, bisphenol-A, bisphenol-S, 4,4'-isopropylidene-di-o-cresol, 5-tert-butylpyrogallol, hexafluorobisphenol-A, 3,3,3',3'-tetramethyl-1,1'-spirobisindane-5,5',6,6'-tetrol, 4,4'-(9-fluorenylidene) diphenol, bisphenol-AP, bisphenol-P, 5-α,α-dimethyl-4-hydroxybenzylsalicylic acid, α,α,α'-tris(4-hydroxyphenyl)-1ethyl-4-isopropylbenzene, 5,5'-di-tert-butyl-2,2',4,4'-tetrahydroxybenzophenone and the like, multivalent carboxylic acids such as pyromellitic acid, phthalic acid, trimellic acid, 4-sulfophthalic acid, benzene hexacarboxylic acid, 2,3-naphthalene dicarboxylic acid, 4-hydroxyphthalic acid, 3,4-dihydroxyphthalic acid, 4,5-dihydroxyphthalic acid, 3,3',4,4'-biphenyl tetracarboxylic acid, 3,3',4,4'-benzophenone tetracarboxylic acid, 3,3',4,4'-biphenylether tetracarboxylic acid, 3,3',4,4'-diphenylsulfone tetracarboxylic acid, 1,2,3,4-cyclobutane tetracarboxylic acid, 1,2-dimethyl-1,2,3,4-cyclobutane tetracarboxylic acid, 1,2,3,4-tetramethyl-1,2,3,4-cyclobutane tetracarboxylic acid, 1,2,3,4-cyclopentane tetracarboxylic acid, 1,2,3,4-cyclohexane tetracarboxylic acid, and 3,4-dicarboxy-1,2,3,4-tetrahydro-1-naphthalene succinic acid, etc., polymers containing carboxylic acid or carboxylic anhydride such as polyacrylic acid, polymethacrylic acid, polyamic acid, and poly maleic anhydride, etc., polymers containing phenolic hydroxyl group such as phenol novolak, polyhydroxystyrene, and naphthol novolak, etc. The above-mentioned compound is optionally used in an addition amount of 20 mass % or less, preferably 10 mass % or less in the solid content of the anti-reflective coating forming composition.

The anti-reflective coating forming composition according to the present invention can contain a compound having a carboxyl group or a phenolic hydroxyl group protected with a group that is easily decomposable in the presence of tert-butyl group, tetrahydropyranyl group, 1-ethoxyethyl group and trimethylsilyl group, etc. in order to control the dissolution speed in developer for photoresist.

Such compounds include for example di-tert-butylmalonate, tert-butylacetate, tert-butylpropionate, tert-butylacetacetate, tert-amylacetate, benzoic acid-tert-butyl ester and tert-butylpivalate, etc. Further, the compounds of formulae (46) to (54) can be mentioned.

(46)
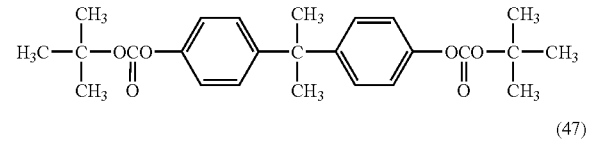

(47)
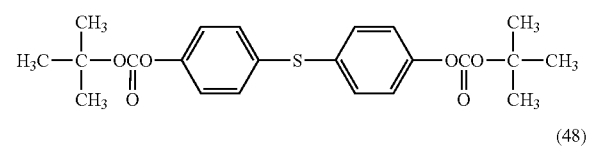

(48)
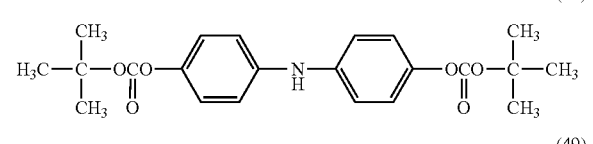

(49)
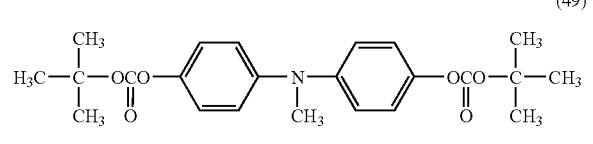

(50)
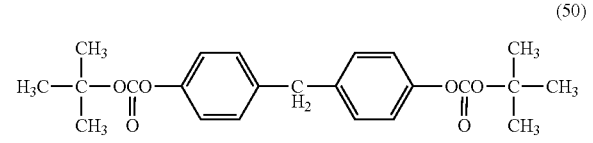

(51)
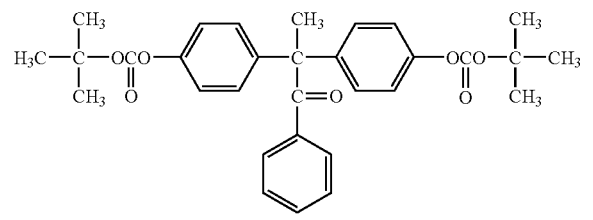

(52)
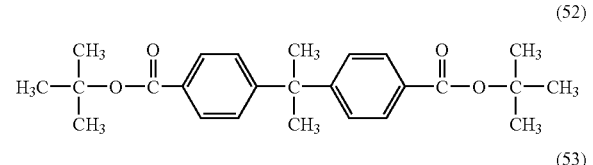

(53)
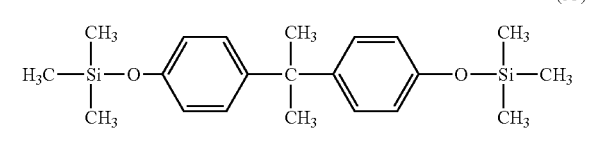

-continued

(54)
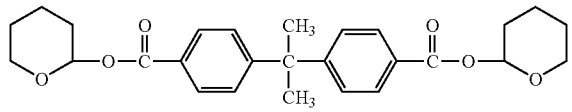

These compounds can easily produce a carboxyl group or a phenolic hydroxyl group in the presence of an acid and afford a compound improved in solubility in an alkaline developer for photoresist.

Therefore, it is preferable to add these compounds in the anti-reflective coating forming composition together with a photoacid acid. That is, in the anti-reflective coating formed from the anti-reflective coating forming composition containing a compound having a carboxyl group or a phenolic hydroxyl group protected with a group that is easily decomposable in the presence of an acid, and a photoacid generator, the carboxyl group or phenolic hydroxyl group of the compound having a carboxyl group or a phenolic hydroxyl group protected with a group that is easily decomposable in the presence of an acid is regenerated by the acid generated from the photoacid generator due to exposure light in the exposed part. As a result of it, the exposed part of the anti-reflective coating is improved in the solubility in an alkaline developer. On the contrary, the compound having a carboxyl group or a phenolic hydroxyl group protected with a group that is easily decomposable in the presence of an acid is not changed in the non-exposed part, and thus the solubility of the part in the anti-reflective coating in an alkaline solution is not improved. Therefore, the use of a compound having a carboxyl group or a phenolic hydroxyl group protected with a group that is easily decomposable in the presence of an acid and a photoacid generator together leads to a difference in solubility in an alkaline developer between exposed part and non-exposed part of the anti-reflective coating after exposure to light, and facilitates pattern formation by development.

When the compound having a carboxyl group or a phenolic hydroxyl group protected with a group that is easily decomposable in the presence of an acid is used, the content amount is for example 1 to 50 mass parts, or 5 to 30 mass parts, or for example 10 to 20 mass parts based on 100 mass parts of the polyamic acid.

The anti-reflective coating forming composition according to the present invention can contain surfactants. The surfactants include, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether; polyoxyethylene/polyoxypropylene block copolymers, etc., sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., EFTOP EF301, EF303, EF352 (Tochem Products Co., Ltd.), MEGAFAC F171, F173 (Dainippon Ink and Chemicals, Inc.), FLUORAD FC430, FC431 (Sumitomo 3M Limited), ASAHI GUARD AG710, SURFLON S-382, SC101, SC102, SC103, SC104, SC105, SC106 (Asahi Glass Co., Ltd.), organosiloxane polymer KP341 (Shinetsu Chemical Co., Ltd.), etc. The blending amount of the surfactants is usually 0.2 mass % or less, preferably 0.1 mass % or less, in all components of the anti-reflective coating forming composition according to the present invention. The surfactants may be added singly or in a combination of two or more.

The anti-reflective coating forming composition according to the present invention may optionally contain rheology controlling agents, adhesion auxiliaries and the like.

Hereinafter, the utilization of the anti-reflective coating forming composition according to the present invention is described.

On a semiconductor substrate (for example, silicon/silicon dioxide coat substrate, silicon nitride substrate, glass substrate, ITO substrate or the like), the anti-reflective coating forming composition according to the present invention is coated by a suitable coating method, for example, with a spinner, a coater or the like, and thereafter the substrate is baked to fabricate an anti-reflective coating. The conditions of baking are suitably selected from baking temperature of 80 to 300° C. and baking time of 0.3 to 60 minutes. The thickness of the anti-reflective coating is for example 0.01 to 3.0 μm, for example 0.03 to 1.0 μm, or 0.05 to 0.5 μm.

The dissolution speed of the formed anti-reflective coating in a developer for photoresist is 0.1 nm to 50 nm per second, preferably 0.2 to 40 nm per second, more preferably 0.3 to 20 nm per second. When the dissolution speed is lower than the above-mentioned lower limit, the time required for removal of the anti-reflective coating is prolonged and thus a lowering of producibility is induced. When the dissolution speed is higher than the above-mentioned higher limit, anti-reflective coating under the resist non-exposed part is also dissolved and thus a resist pattern cannot be obtained.

The anti-reflective coating formed from the anti-reflective coating forming composition according to the present invention can control the dissolution speed of the anti-reflective coating in a developer for photoresist by altering baking condition when the coating is formed. In case where baking time is constant, the higher the baking temperature is, the lower the dissolution speed of the anti-reflective coating in a developer for photoresist becomes. Next, a photoresist layer is formed on the anti-reflective coating. The formation of the photoresist layer can be conducted by a general process, that is, by application of a photoresist solution on the anti-reflective coating and baking.

The photoresist to be coated and formed on the anti-reflective coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shinetsu Chemical Co., Ltd., and the like can be mentioned.

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake (PEB) may be performed, if necessary.

Next, development is conducted by use of a developer for photoresist. For example in case where a developer for positive type photoresist is used, the development results in removal of the exposed part of the photoresist and the exposed part of the underlayer anti-reflective coating. The developer for photoresist includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, chlorine or the like, amine aqueous solution such as ethanolamine, propylamine, ethylenediamine or the like. Further, surfactants can be added in these developers. The condition of development is suitably selected from a temperature of 5 to 50° C. and a time of 10 to 300 seconds.

The anti-reflective coating formed from the anti-reflective coating forming composition according to the present invention can be easily developed at room temperature by use of 2.38 mass % aqueous solution of tetramethylammonium hydroxide that is generally used.

The anti-reflective coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion and adverse effects of substances formed in the substrate on baking under heating to the upper layer photoresist, or as a barrier layer for reducing any poisoning effect of the photoresist layer by the semiconductor substrate dielectric layer.

Hereinafter, the present invention will be described based on examples but the present invention is not limited thereto.

EXAMPLES

Example 1

Synthesis of Polyamic Acid

In 55.6 g of propylene glycol monomethyl ether, 4.36 g of pyromellitic dianhydride, 1.19 g of 3,5-diaminobenzoic acid and 4.26 g of 2,2-bis(3-amino-4-toluyl) hexafluoropropane were reacted at 60° C. for 25 hours to obtain solution [A] containing polyamic acid. GPC analysis of the resulting polyamic acid showed that it had a weight average molecular weight Mw of 7600 (in terms of standard polystyrene) and a number average molecular weight Mn of 4100.

(Synthesis of Light Absorbing Compound)

In 118 g of cyclohexanone, 19.0 g of 3,7-dihydroxy-2-naphthoic acid, 10 g of tris(2,3-epoxypropyl)isocyanurate and 0.552 g of benzyl triethyl ammonium chloride were reacted at 130° C. for 24 hours to solution [a] containing light absorbing compound (a compound of formula (55)).

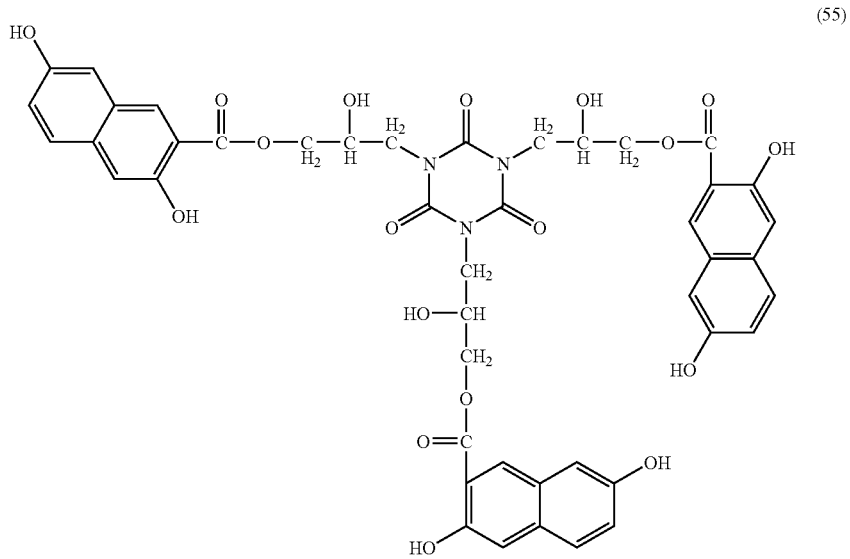

(55)

(Preparation of Anti-Reflective Coating Forming Composition)

To 14.0 g of solution [A] containing polyamic acid, 4.38 g of solution [a] containing light absorbing compound, 0.630 g of tris(2,3-epoxypropyl)isocyanurate, 52.3 g of propylene glycol monomethyl ether and 67.5 g of propylene glycol monomethyl ether acetate were added, and stirred at room temperature for 30 minutes to prepare anti-reflective coating forming composition solution [1].

(Evaluation of Anti-Reflective Coating Forming Composition)

The anti-reflective coating forming composition solution [1] was coated on a semiconductor substrate (silicon wafer) using a spinner and the substrate was heated at 200° C. for 60 seconds on a hot plate to form an anti-reflective coating having a film thickness of 40 nm. The resulting anti-reflective coating was insoluble in ethyl lactate and propylene glycol monomethyl ether acetate. Measurement of the anti-reflective coating by an ellipsometer indicated a refractive index (n) of 1.67 and an attenuation coefficient (k) of 0.39 at wavelength 248 nm, and a refractive index (n) of 1.53 and an attenuation coefficient (k) of 0.42 at wavelength 193 nm.

In addition, anti-reflective coatings were formed similarly at a baking temperature of 190° C., 210° C. and 220° C. It was confirmed that these anti-reflective coatings were insoluble in ethyl lactate and propylene glycol monomethyl ether acetate.

Then, dissolution speed of the anti-reflective coating in a developer (manufactured by Tokyo Ohka Kogyo Co., Ltd., trade name: NMD-3) was measured with a resist development analyzer (manufactured by Litho Tech Japan Co., Ltd.). The anti-reflective coating formed by a condition of baking temperature 190° C. and baking time 60 seconds had a dissolution speed of 10.7 nm per second. In addition, the anti-reflective coating formed by a condition of baking temperature 200° C. and baking time 60 seconds had a dissolution speed of 2.0 nm per second, the anti-reflective coating formed by a condition of baking temperature 210° C. and baking time 60 seconds had a dissolution speed of 0.9 nm per second, and the anti-reflective coating formed by a condition of baking temperature 220° C. and baking time 60 seconds had a dissolution speed of 0.61 nm per second.

The anti-reflective coating forming composition solution [1] was coated on a silicon wafer substrate using a spinner and the substrate was heated at 200° C. for 60 seconds on a hot plate to form an anti-reflective coating having a film thickness of 40 nm. On the resulting anti-reflective coating, a positive type photoresist layer for KrF was formed, and exposed to light with KrF excimer laser beam (wavelength 248 nm) through a mask configured so as to form 200 nm line/space pattern.

After post exposure bake at 110° C. for 90 seconds, puddle development was carried out with 2.38% tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed even in 200 nm line/space.

Example 2

Preparation of Anti-Reflective Coating Forming Composition

To 14.0 g of solution [A] containing polyamic acid used in Example 1, 4.38 g of solution [a] containing light absorbing compound used in Example 1, 0.630 g of tris(2,3-epoxypropyl)isocyanurate, 0.0450 g of 2,4,6-tris(4-hydroxyphenylmethyl)-1,3-benzenediol, 52.8 g of propylene glycol monomethyl ether and 67.5 g of propylene glycol monomethyl ether acetate were added, and stirred at room temperature for 30 minutes to prepare anti-reflective coating forming composition solution [2].

(Evaluation of Anti-Reflective Coating Forming Composition)

The anti-reflective coating forming composition solution [2] was coated on a silicon wafer substrate using a spinner and the substrate was heated at 200° C. for 60 seconds on a hot plate to form an anti-reflective coating having a film thickness of 40 nm. The resulting anti-reflective coating was insoluble in ethyl lactate and propylene glycol monomethyl ether acetate. Measurement of the anti-reflective coating by an ellipsometer indicated a refractive index (n) of 1.67 and an attenuation coefficient (k) of 0.39 at wavelength 248 nm, and a refractive index (n) of 1.53 and an attenuation coefficient (k) of 0.42 at wavelength 193 nm.

In addition, anti-reflective coatings were formed similarly at a baking temperature of 190° C., 210° C. and 220° C. It was confirmed that these anti-reflective coatings were insoluble in ethyl lactate and propylene glycol monomethyl ether acetate.

Then, dissolution speed of the anti-reflective coating in a developer (manufactured by Tokyo Ohka Kogyo Co., Ltd., trade name: NMD-3) was measured with a resist development analyzer (manufactured by Litho Tech Japan Co., Ltd.). The anti-reflective coating formed by a condition of baking temperature 190° C. and baking time 60 seconds had a dissolution speed of 11.7 nm per second. In addition, the anti-reflective coating formed by a condition of baking temperature 200° C. and baking time 60 seconds had a dissolution speed of 2.3 nm per second, the anti-reflective coating formed by a condition of baking temperature 210° C. and baking time 60 seconds had a dissolution speed of 1.1 nm per second, and the anti-reflective coating formed by a condition of baking temperature 220° C. and baking time 60 seconds had a dissolution speed of 0.83 nm per second.

The anti-reflective coating forming composition solution [2] was coated on a silicon wafer substrate using a spinner and the substrate was heated at 220° C. for 60 seconds on a hot plate to form an anti-reflective coating having a film thickness of 40 nm. On the resulting anti-reflective coating, a positive type photoresist layer for KrF was formed, and exposed to light with KrF excimer laser beam (wavelength 248 nm) through a mask configured so as to form 200 nm line/space pattern.

After post exposure bake at 110° C. for 90 seconds, puddle development was carried out with 2.38% tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed even in 200 nm line/space.

Example 3

Synthesis of Polyamic Acid

In 55.6 g of propylene glycol monomethyl ether, 4.36 g of pyromellitic dianhydride, 0.89 g of 3,5-diaminobenzoic acid and 4.97 g of 2,2-bis(3-amino-4-toluyl) hexafluoropropane were reacted at 60° C. for 25 hours to obtain solution [B] containing polyamic acid. GPC analysis of the resulting polyamic acid showed that it had a weight average molecular weight Mw of 8500 (in terms of standard polystyrene) and a number average molecular weight Mn of 3900.

(Preparation of Anti-Reflective Coating Forming Composition)

To 14.0 g of solution [B] containing polyamic acid, 4.38 g of solution [a] containing light absorbing compound used in Example 1, 0.630 g of tris(2,3-epoxypropyl)isocyanurate, 52.4 g of propylene glycol monomethyl ether and 67.5 g of propylene glycol monomethyl ether acetate were added, and stirred at room temperature for 30 minutes to prepare anti-reflective coating forming composition solution [3].

(Evaluation of Anti-Reflective Coating Forming Composition)

The anti-reflective coating forming composition solution [3] was coated on a silicon wafer substrate using a spinner and the substrate was heated at 200° C. for 60 seconds on a hot plate to form an anti-reflective coating having a film thickness of 40 nm. The resulting anti-reflective coating was insoluble in ethyl lactate and propylene glycol monomethyl ether acetate. Measurement of the anti-reflective coating by an ellipsometer indicated a refractive index (n) of 1.67 and an attenuation coefficient (k) of 0.39 at wavelength 248 nm, and a refractive index (n) of 1.53 and an attenuation coefficient (k) of 0.42 at wavelength 193 nm.

In addition, anti-reflective coatings were formed similarly at a baking temperature of 190° C., 210° C. and 220° C. It was confirmed that these anti-reflective coatings were insoluble in ethyl lactate and propylene glycol monomethyl ether acetate.

Then, dissolution speed of the anti-reflective coating in a developer (manufactured by Tokyo Ohka Kogyo Co., Ltd., trade name: NMD-3) was measured with a resist development analyzer (manufactured by Litho Tech Japan Co., Ltd.). The anti-reflective coating formed by a condition of baking temperature 190° C. and baking time 60 seconds had a dissolution speed of 9.7 nm per second. In addition, the anti-reflective coating formed by a condition of baking temperature 200° C. and baking time 60 seconds had a dissolution speed of 1.7 nm per second, the anti-reflective coating formed by a condition of baking temperature 210° C. and baking time 60 seconds had a dissolution speed of 0.7 nm per second, and the anti-reflective coating formed by a condition of baking temperature 220° C. and baking time 60 seconds had a dissolution speed of 0.53 nm per second.

The anti-reflective coating forming composition solution [3] was coated on a silicon wafer substrate using a spinner and the substrate was heated at 210° C. for 60 seconds on a hot plate to form an anti-reflective coating having a film thickness of 40 nm. On the resulting anti-reflective coating, a positive type photoresist layer for KrF was formed, and exposed to light with KrF excimer laser beam (wavelength 248 nm) through a mask configured so as to form 200 nm line/space pattern.

After post exposure bake at 110° C. for 90 seconds, puddle development was carried out with 2.38% tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed even in 200 nm line/space.

Example 4

Preparation of Anti-Reflective Coating Forming Composition

To 14.0 g of solution [A] containing polyamic acid used in Example 1, 4.38 g of solution [a] containing light absorbing compound used in Example 1, 0.630 g of 4,4'-methylenebis (diglycidylaniline) (manufactured by Tohto Kasei Co., Ltd.), 52.8 g of propylene glycol monomethyl ether and 67.5 g of propylene glycol monomethyl ether acetate were added, and stirred at room temperature for 30 minutes to prepare anti-reflective coating forming composition solution [4].

(Evaluation of Anti-Reflective Coating Forming Composition)

The anti-reflective coating forming composition solution [4] was coated on a silicon wafer substrate using a spinner and the substrate was heated at 200° C. for 60 seconds on a hot plate to form an anti-reflective coating having a film thickness of 40 nm. The resulting anti-reflective coating was insoluble in ethyl lactate and propylene glycol monomethyl ether acetate. Measurement of the anti-reflective coating by an ellipsometer indicated a refractive index (n) of 1.67 and an attenuation coefficient (k) of 0.39 at wavelength 248 nm, and a refractive index (n) of 1.53 and an attenuation coefficient (k) of 0.42 at wavelength 193 nm.

In addition, anti-reflective coatings were formed similarly at a baking temperature of 190° C., 210° C. and 220° C. It was confirmed that these anti-reflective coatings were insoluble in ethyl lactate and propylene glycol monomethyl ether acetate.

Then, dissolution speed of the anti-reflective coating in a developer (manufactured by Tokyo Ohka Kogyo Co., Ltd., trade name: NMD-3) was measured with a resist development analyzer (manufactured by Litho Tech Japan Co., Ltd.). The anti-reflective coating formed by a condition of baking temperature 190° C. and baking time 60 seconds had a dissolution speed of 9.7 nm per second. In addition, the anti-reflective coating formed by a condition of baking temperature 200° C. and baking time 60 seconds had a dissolution speed of 0.55 nm per second, the anti-reflective coating formed by a condition of baking temperature 210° C. and baking time 60 seconds had a dissolution speed of 0.37 nm per second, and the anti-reflective coating formed by a condition of baking temperature 220° C. and baking time 60 seconds had a dissolution speed of 0.13 nm per second.

The anti-reflective coating forming composition solution [4] was coated on a silicon wafer substrate using a spinner and the substrate was heated at 210° C. for 60 seconds on a hot plate to form an anti-reflective coating having a film thickness of 40 nm. On the resulting anti-reflective coating, a positive type photoresist layer for KrF was formed, and exposed to light with KrF excimer laser beam (wavelength 248 nm) through a mask configured so as to form 200 nm line/space pattern.

After post exposure bake at 110° C. for 90 seconds, puddle development was carried out with 2.38% tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed even in 200 nm line/space.

Example 5

Synthesis of Polyamic Acid

In 145.6 g of propylene glycol monomethyl ether, 17.8 g of 4,4'-(hexafluoroisopropylidene) diphthalic dianhydride, 3.12 g of 3,5-diaminobenzoic acid and 4.92 g of bis(4-aminophenylsulfone) were reacted at 80° C. for 20 hours to obtain solution [C] containing polyamic acid. GPC analysis of the resulting polyamic acid showed that it had a weight average molecular weight Mw of 8600 (in terms of standard polystyrene) and a number average molecular weight Mn of 5200.

(Preparation of Anti-Reflective Coating Forming Composition)

To 25.0 g of solution [C] containing polyamic acid, 4.15 g of solution [a] containing light absorbing compound, 1.13 g of 4,4'-methylenebis(N,N-diglycidylaniline), 0.825 g of 3,7-dihydroxynaphthoic acid, 0.124 g of triphenylsulfonium trifluoromethane sulfonate, 82.8 g of propylene glycol monomethyl ether, 127 g of propylene glycol monomethyl ether acetate and 10.0 g of cyclohexanone were added, and stirred at room temperature for 30 minutes to prepare anti-reflective coating forming composition solution [5].

(Evaluation of Anti-Reflective Coating Forming Composition)

The anti-reflective coating forming composition solution [5] was coated on a silicon wafer substrate using a spinner and the substrate was heated at 175° C. for 60 seconds on a hot plate to form an anti-reflective coating having a film thickness of 40 nm. The resulting anti-reflective coating was insoluble in ethyl lactate and propylene glycol monomethyl ether acetate. Measurement of the anti-reflective coating by an ellipsometer indicated a refractive index (n) of 1.80 and an attenuation coefficient (k) of 0.44 at wavelength 248 nm, and a refractive index (n) of 1.50 and an attenuation coefficient (k) of 0.44 at wavelength 193 nm.

In addition, anti-reflective coatings were formed similarly at a baking temperature of 170° C. and 180° C. It was confirmed that these anti-reflective coatings were insoluble in ethyl lactate and propylene glycol monomethyl ether acetate.

Then, dissolution speed of the anti-reflective coating in a developer (manufactured by Tokyo Ohka Kogyo Co., Ltd., trade name: NMD-3) was measured with a resist development analyzer (manufactured by Litho Tech Japan Co., Ltd.). The anti-reflective coating formed by a condition of baking temperature 175° C. and baking time 60 seconds had a dissolution speed of 2.00 nm per second. In addition, the anti-reflective coating formed by a condition of baking temperature 170° C. and baking time 60 seconds had a dissolution speed of 2.35 nm per second, and the anti-reflective coating formed by a condition of baking temperature 180° C. and baking time 60 seconds had a dissolution speed of 1.82 nm per second.

The anti-reflective coating forming composition solution [5] was coated on a silicon wafer substrate using a spinner and the substrate was heated at 220° C. for 60 seconds on a hot plate to form an anti-reflective coating having a film thickness of 40 nm. On the resulting anti-reflective coating, a positive type photoresist layer for KrF was formed, and exposed to light with KrF excimer laser beam (wavelength 248 nm) through a mask configured so as to form 200 nm line/space pattern. After post exposure bake at 110° C. for 90 seconds, puddle development was carried out with 2.38% tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed even in 200 nm line/space.

Comparative Example 1

Synthesis of Polyamic Acid

In 55.6 g of propylene glycol monomethyl ether, 4.36 g of pyromellitic dianhydride, 0.838 g of p-phenylenediamine and 4.26 g of 2,2-bis(3-amino-4-toluyl) hexafluoropropane were reacted at 60° C. for 25 hours to obtain polyamic acid solution [D]. GPC analysis of the resulting polyamic acid showed that it had a weight average molecular weight Mw of 8600 (in terms of standard polystyrene) and a number average molecular weight Mn of 4800.

(Preparation of Anti-Reflective Coating Forming Composition)

To 14.0 g of polyamic acid solution [D], 4.38 g of solution [a] containing light absorbing compound used in Example 1, 0.630 g of tris(2,3-epoxypropyl)isocyanurate, 52.3 g of propylene glycol monomethyl ether and 67.5 g of propylene glycol monomethyl ether acetate were added, and stirred at room temperature for 30 minutes to prepare anti-reflective coating forming composition solution [6].

(Evaluation of Anti-Reflective Coating Forming Composition)

The anti-reflective coating forming composition solution [6] was coated on a silicon wafer substrate using a spinner and the substrate was heated at 200° C. for 60 seconds on a hot plate to form an anti-reflective coating having a film thickness of 40 nm. The resulting anti-reflective coating was insoluble in ethyl lactate and propylene glycol monomethyl ether acetate. Measurement of the anti-reflective coating by an ellipsometer indicated a refractive index (n) of 1.68 and an attenuation coefficient (k) of 0.40 at wavelength 248 nm, and a refractive index (n) of 1.53 and an attenuation coefficient (k) of 0.42 at wavelength 193 nm.

The anti-reflective coating formed from the anti-reflective coating forming composition solution [6] was insoluble in 2.38% tetramethylammonium hydroxide aqueous solution (manufactured by Tokyo Ohka Kogyo Co., Ltd., trade name: NMD-3).

The invention claimed is:

1. An anti-reflective coating forming composition that is capable of being developed with an alkaline developer, the composition comprising:

a polyamic acid having a structure of formula (1):

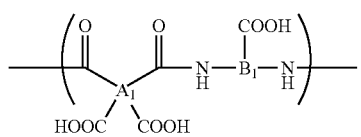

(1)

wherein $A_1$ is a tetravalent organic group, and $B_1$ is a trivalent organic group, a compound containing at least two epoxy groups in an amount of 5 to 70 mass parts based on 100 mass parts of the polyamic acid, and a solvent.

2. An anti-reflective coating forming composition that is capable of being developed with an alkaline developer, the composition comprising:

a polyamic acid having a structure of formula (1) and a structure of formula (2):

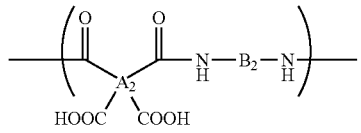

(2)

wherein $A_2$ is a tetravalent organic group, and $B_2$ is a divalent organic group, a compound containing at least two epoxy groups in an amount of 5 to 70 mass parts based on 100 mass parts of the polyamic acid, and a solvent.

3. The composition according to claim 1, wherein the polyamic acid is a polyamic acid produced from (a) a tetracarboxylic dianhydride compound and (b) a diamine compound having at least one carboxyl group.

4. The composition according to claim 2, wherein the polyamic acid is a polyamic acid produced from (a) a tetracarboxylic dianhydride compound, (b) a diamine compound having at least one carboxyl group, and (c) a diamine compound.

5. The composition according to claim 3, wherein the tetracarboxylic dianhydride compound (a) is a tetracarboxylic dianhydride compound having at least one benzene ring structure.

6. The composition according to claim 3, wherein the diamine compound having at least one carboxyl group (b) is a diamine compound having at least one benzene ring structure.

7. The composition according to claim 4, wherein the diamine compound (c) is a diamine compound having two benzene ring structures.

8. The composition according to claim 1, wherein the polyamic acid has a weight average molecular weight of 1000 to 50000.

9. The composition according to claim 1, wherein the compound having at least two epoxy groups is a compound having three epoxy groups.

10. The composition according to claim 1, further containing a light absorbing compound.

11. The composition according to claim 1, further containing a photoacid generator.

12. An anti-reflective coating formed by coating the anti-reflective coating forming composition according to claim 1 on a semiconductor substrate, and baking it, wherein the anti-reflective coating has a dissolution speed of 0.2 nm to 40 nm per second.

13. A method of forming a photoresist pattern used in a manufacture of a semiconductor device, comprising the steps of:

coating the anti-reflective coating forming composition according to claim 1 on a semiconductor substrate and baking it to form an anti-reflective coating, forming a photoresist layer on the anti-reflective coating, exposing the semiconductor substrate covered with the anti-reflective coating and the photoresist layer to light, and developing the exposed semiconductor substrate.

14. The method of forming a photoresist pattern according to claim 13, wherein the exposure is carried out with light having a wavelength of 248 nm or 193 nm.

* * * * *